United States Patent [19]

Magdo et al.

[11] Patent Number: 4,965,652

[45] Date of Patent: Oct. 23, 1990

[54] DIELECTRIC ISOLATION FOR HIGH DENSITY SEMICONDUCTOR DEVICES

[75] Inventors: Ingrid E. Magdo; Steven Magdo, both of Hopewell Junction, N.Y.

[73] Assignee: International Business Machines Corporation, Armonk, N.Y.

[21] Appl. No.: 290,586

[22] Filed: Sep. 20, 1972

Related U.S. Application Data

[62] Division of Ser. No. 150,609, Jun. 7, 1971.

[51] Int. Cl.⁵ .............................................. H01L 27/04
[52] U.S. Cl. ....................................................... 352/50
[58] Field of Search ........................................ 357/50

[56] References Cited

U.S. PATENT DOCUMENTS

| | | | |
|---|---|---|---|
| 3,386,865 | 6/1968 | Doo | 357/50 |
| 3,534,234 | 10/1970 | Clevenger | 357/50 |
| 3,615,929 | 10/1971 | Portnoy et al. | 357/850 |
| 3,648,125 | 3/1972 | Peltzer | 357/50 |

OTHER PUBLICATIONS

Electronic Design 20, Sep. 26, 1968, pp. 64–65.

Jones et al., Electrochemical Technology, vol. 5, No. 5–6, May–Jun. 1967, pp. 308–310.
Doo et al., IBM Tech. Discl. Bull., vol. 8, No. 4, Sep. 1965, pp. 659–660.

*Primary Examiner*—William D. Larkins
*Attorney, Agent, or Firm*—Robert J. Haase; George O. Saile; Wolmar J. Stoffel

[57] ABSTRACT

A dielectrically isolated semiconductor device which is substantially planar can be manufactured. The structure is useable for integrated circuits wherein a significant savings in surface area can be obtained over prior techniques. The structure is particularly useful for bipolar integrated circuits wherein a semiconductor substrate with an epitaxial layer thereon contains a buried region partially in the substrate and in the epitaxial layer. The emitter and base regions are located in the epitaxial layer above the buried region. The dielectrically isolating region surrounds the emitter and base region at the surface and extends to a depth wherein it intersects with the buried region to fully isolate the device. The buried region is connected as the collector element of the transistor.

9 Claims, 3 Drawing Sheets

DIELECTRIC ISOLATION FOR HIGH DENSITY SEMICONDUCTOR DEVICES

This is a division of application Ser. No. 150,609, filed Jun. 7, 1971.

BACKGROUND OF THE INVENTION

The invention relates to dielectrically isolated semiconductor devices which are particularly adapted to form a part of an integrated circuit.

DESCRIPTION OF THE PRIOR ART

The advanced form of integrated circuits is the so called monolithic form. Such a structure contains great numbers of active and passive devices in a block or monolith of semiconductor material. Electrical connections between these active and passive components are generally made on the surface of the semiconductor block of material. The usual way of electrically isolating components, where it is desired, within the monolithic block of silicon is by what is called junction isolation wherein, for example, active P type diffusions are used to electrically isolate conventional NPN bipolar devices from one another and from other components such as resistors and capacitors. For a more detailed description of this type of junction isolation, the following patents may be referred to: W. E. Mutter, U.S. Pat. No. 3,319,311 issued May 16, 1967 and U.S. Pat. No. 3,451,866 issued Jun. 24, 1969, and B. Agusta, et al. U.S. Pat. No. 3,508,209 issued Apr. 21, 1970.

Another form of electrical isolation between active and passive devices which has been suggested is called dielectric isolation. In this type of isolation, pockets of semiconductor material are formed within regions of dielectric material such as silicon dioxide. Active and/or passive devices are then formed in the pockets of semiconductor material. Examples of this type of process and structure can be seen in greater detail in the R. E. Jones, Jr. U.S. Pat. No. 3,357,871 issued Dec. 12, 1967 and the J. G. Kren, et al. U.S. Pat. No. 3,419,956 issued Jan. 7, 1969. A variation on this technique for forming dielectric regions which isolate semiconductor regions is shown in the V. Y. Doo U.S. Pat. No. 3,386,865 issued Jun. 4, 1968 wherein a thermally grown silicon dioxide layer is formed on a substrate of silicon semiconductor material, openings formed in the silicon dioxide layer, epitaxial growth of silicon made in these opening well above the upper level of the silicon dioxide layer. Epitaxial layers do not grow where silicon dioxide coating is present, thus empty channels are formed. Pyrolytic SiO$_2$ is deposited on the top to fill the empty channels. The pyrolytic SiO$_2$ is then partly removed by abrading or differential etching to expose the epitaxial layers and to remove the large steps from the surface of the pyrolytic SiO$_2$. Finally, semiconductor devices are formed within these silicon epitaxial regions.

The dielectrically isolated type of electrical isolation has not been significantly used up to the present time for a variety of reasons which include principally manufacturability difficulties. For example, the principal difficulty in Doo's patented process is the removal of the several micron steps from the surface of the pyrolytic SiO$_2$ above the epitaxial regions. The only way to do that is abrading which is expensive and difficult to control. Further, the junction isolation has been very adequate up until the present time for the density of components required on a monolithic chip. However, it is now desired to substantially increase the density of semiconductor devices within the silicon monolithic integrated circuit for the bipolar devices to compete with field effect transistor monolithic integrated circuits which do not require special electrical isolation between devices. This type of device is inherently electrically isolated from the next device within the semiconductor monolith.

SUMMARY OF THE INVENTION

An object of the present invention is to provide a dielectrically isolated semiconductor device structure such as resistors, Schottky barrier diodes, and bipolar transistors, and method for manufacture which allows increased density within the monolithic chip while not requiring significant manufacturability problems.

Another object of the invention is to provide a dielectrically isolated bipolar integrated circuit structure and method for manufacture wherein the packing density of the devices is significantly high and the surface is planar while stray capacitances, collector-base capacitances, and isolation capacitances are significantly less than junction isolated structure.

These and other objects of the invention are accomplished according to the broad aspects of this invention by providing a semiconductor substrate with an epitaxial layer grown thereon. A buried region is present partially in the substrate and the epitaxial layer. This region can be formed by thermal diffusion into the semiconductor substrate prior to the formation of the epitaxial layer. The formation of the epitaxial layer will result in a movement of the buried region into the epitaxial layer. Another way that this may be formed is by ion implantation into a semiconductor substrate with or without an epitaxial layer. Emitter and base regions are then formed above the buried region and a dielectrically isolating region formed surrounding the emitter and base regions. This dielectrically isolating region would extend to the depth wherein it intersects the buried region. The buried region can be connected as the collector of the semiconductor device. The device is isolated from other devices by this combination of the dielectrically isolating region touching the buried region.

Because the dielectric material surrounds the emitter and base area, base or emitter contacts can be opened at the edge of the base diffusion. This reduces the base area and thereby the base to collector capacitance. Area saving for resistors is substantial and at the same time much closer tolerances can be obtained. If an epitaxial N resistor is desired, depending upon resistivity requirements, undoped or N type epi is to be deposited, in which case either a blanket P diffusion into the N substrate or masked P diffusion is needed. All devices are self-alignable.

DESCRIPTION OF THE PREFERRED EMBODIMENTS

Figure 1:
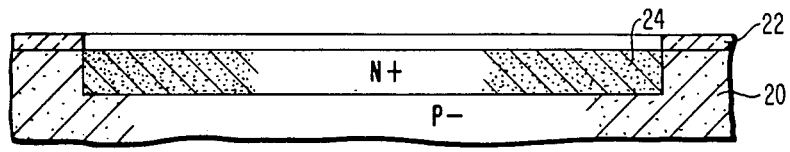
FIGS. 1 through 4 show sectional views of a fabrication method used to produce one embodiment of the present invention.
Figure 2:
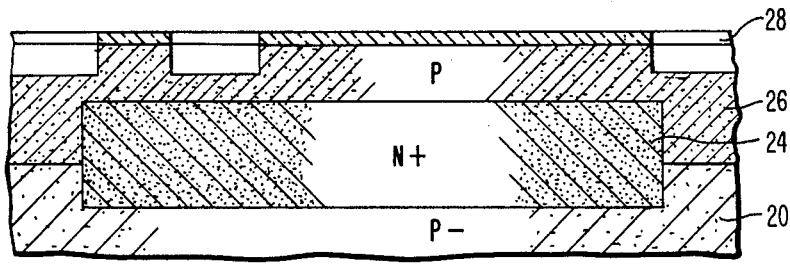

FIGS. 1 through 4 illustrate one method for manufacturing a resulting structure of a bipolar semiconductor device which may be a portion of an integrated circuit. It is, of course, not necessary that the device be a bipolar semiconductor device but the semiconductor device could be a MOS field effect transistor, a resistor, capacitor or other active or passive devices. Alternately, active and/or passive devices could be formed by this method within one of these regions. For the purpose of description, a P- type silicon substrate is utilized and a NPN type semiconductor device is formed by the process. It is, of course, understood that the invention will also be applicable to the opposite type conductivities as well as to other semiconductor materials. A suitable wafer 20 of P- material is obtained with a high quality polished surface. The wafer is thermally oxidized in the usual manner which may be by placing the silicon body in an oxidizing atmosphere at an elevated temperature with or without the addition of water vapor to the oxidation atmosphere. A layer could alternately be formed by other known techniques, such as pyrolytic deposition of silicon dioxide or other insulating materials. Openings in the silicon dioxide layer 22 are provided using conventional photoresist and etching technologies. A suitable etchant for silicon dioxide is an ammonium fluoride buffered solution of hydrofluoric acid. Following the etching step, all photoresist materials are removed by a suitable photoresist solvent. The N+ region 24 is formed by, for example, thermally diffusing an N+ impurity such as phosphorus, arsenic, antimony or the like through the opening in the silicon dioxide layer 22. The diffusion may be made by the usual open tube or closed tube thermal diffusion techniques, which is followed by a reoxidation cycle.

The silicon dioxide layer 22 is then stripped from the surface of the wafer 20 by use of a buffered ammonium fluoride solution of hydrofluoric acid. A P epitaxial layer 26 is formed on the surface of the P- substrate 20. The N+ region 24 in the substrate moves partially into the epitaxial layer as it is grown due to the elevated temperatures at which the epitaxial layer is grown. The epitaxial layer may be formed using the apparatus and method described in the E. O. Ernst, et al. U.S. Pat. No. 3,424,629 issued Jan. 28, 1969.

A protective layer 28 is applied using known techniques such as pyrolytic deposition or cathode sputtering. A preferred protective layer is silicon nitride which can be formed by the pyrolytic technique of the reaction of silane and ammonium or other nitrogen containing compound as described in the V. Y. Doo, et al. patent application Ser. No. 629,338 filed Feb. 8, 1967 following the deposition of the layer 28. Portions of the layer are removed by a suitable etchant such as hot phosphoric salt or hot phosphoric acid in the case of silicon nitride. The protective layer is not removed in areas where it is subsequently intended to have semiconductor devices. The epitaxial layer 26 is etched with a suitable etch for silicon such as nitric acid, mercuric nitrate, and diluted hydrofluoric acid which results in the mesa like structure underneath the silicon nitride layer 28 shown in FIG. 2. The silicon body is then put into an oxidation cycle as described above wherein the body is placed in an oxidation atmosphere at an elevated temperature with or without the addition of water to the oxidation atmosphere. The silicon dioxide layer 30 and 32 is grown until the upper level of the layer is substantially level with the upper surface of the epitaxial layer 26. It should be noted that a portion of the silicon is used up in combining with the oxide so that in the preferred embodiment the silicon dioxide layer intersects with the buried region at least completely around the circumference of this region to isolate the portion of the epitaxial layer directly above the buried region 24. Alternately, the oxidation could be continued until the silicon dioxide dielectric isolating region 30 completely intersects with the substrate 20. It is preferred to limit the depth of the oxidation to the depth wherein it intersects the buried region 24 because this reduces the time for formation of the silicon dioxide layer which is very considerable if the silicon dioxide layer 30 is extended to the substrate 20 and because of undercutting of the protective layer.

Figure 5A:
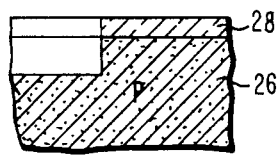
FIGS. 5A and 5B compare the theoretical and actual effect of etching under a protective layer.
Figure 5B:
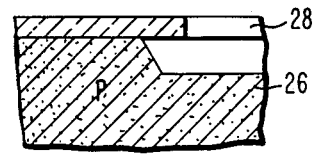

The problem of undercutting may be illustrated with the aid of FIGS. 5A and 5B. Theoretically, there should be no undercutting of the silicon nitride layer 28 with etching of the silicon to provide the mesa like structure. This theoretical lack of undercutting is shown in FIG. 5A. However, FIG. 5B illustrates the actual effect of etching which results in undercutting. During the thermal oxidation to form the silicon dioxide layer 30 and 32, the silicon, including the undercut portion, is thermally oxidized which results in a problem ridge which is formed of silicon dioxide and results in breaking the overhanging portion of the silicon nitride layer. When the depth of the silicon dioxide layer 30 and 32 is increased all the way to the substrate body 20 this ridge is quite significant and affects adversely the planarity of the surface of the integrated circuit.

Figure 3:
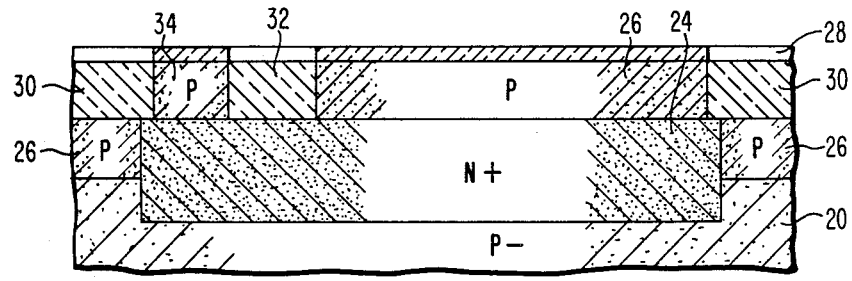

FIG. 3 shows a preferred structure wherein the dielectrically isolating region extends to dielectrically isolate by means of region 32 a reach through region 34 to the buried region 24 from the principal portion of the isolated semiconductor material above the buried region. This is a preferred structure because it reduces the capacitance within and around the device.

The silicon nitride protective layer 28 is then removed with a suitable etchant such as a hot phosphoric salt or hot phosphoric acid over the collector contact area 34. Silicon dioxide over the collector contact area is opened with dip etch in a suitable etchant such as hydrofluoric acid. In this opening a collector reach through diffusion is made by a suitable N dopant such as a capsule phosphorus diffusion. The body is then reoxidized. The silicon nitride remaining on the wafer is then removed with a dip etch using etchant described earlier. This opens the base area to allow a subsequent base diffusion to be made in the semiconductor region above the buried region in all areas except the reach through region 34. The base diffusion may be made by a suitable open tube or closed tube process of the prior art using a suitable P type dopant such as boron or gallium. The base diffusion can also be omitted since the P epitaxial layer gives P doping in the base area. Following this base diffusion, the upper surface is reoxidized by the thermal oxidation technique described above and openings for the emitter region 38 and collector contact region 34 are made. Thermal N+ diffusions are then made using one of the usual N impurities such as aresenic, phosphorus or antimony to produce the emitter and reach through contact regions 34. Openings are then provided in the silicon dioxide for base contacts 40 using the standard photoresist and etching process.

Figure 4:
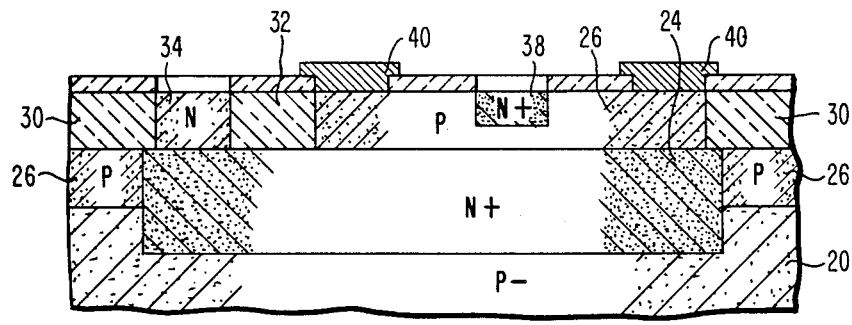
Figure 6:
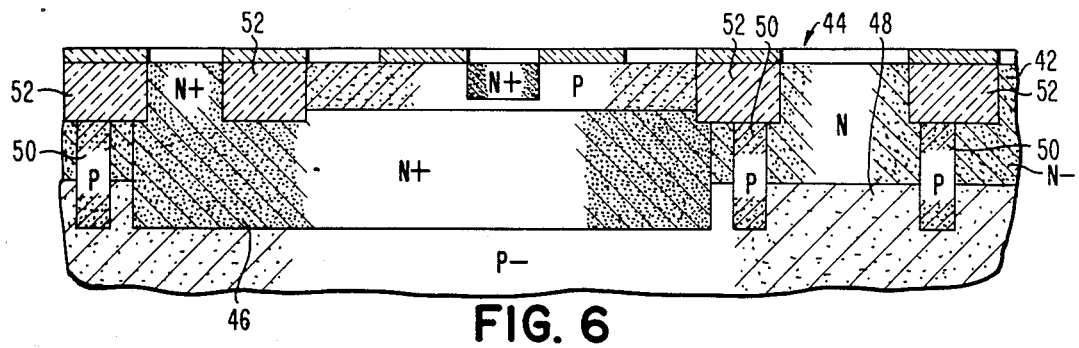
FIG. 6 shows a sectional view of a variation of the first embodiment.

FIG. 6 shows a modified embodiment of the structure of FIG. 4. In this embodiment an N- epitaxial layer 42 is deposited on the P- substrate in order to fabricate an epitaxial N resistor 44 and a bipolar transistor on the same chip. Before the deposition of the epitaxial layer 42 the N+ subcollector region 46 and the region 48 below the resistor 44 are surrounded by a diffused P region 50. These regions will outdiffuse into the N-epitaxial layer. In this embodiment the thermally grown silicon dioxide regions should intersect with the P regions 50 to provide isolation for the bipolar transistor and resistor.

Figure 7:
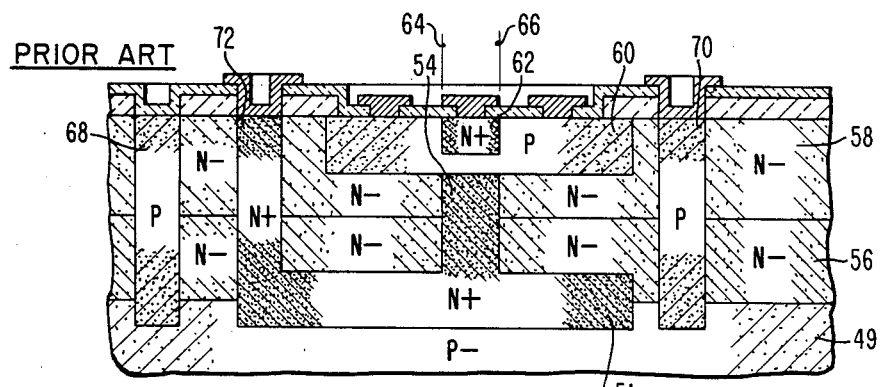
FIG. 7 is a cross-sectional view of a prior art high density integrated circuit.

FIG. 7 is an illustration of the prior art to the embodiment illustrated by FIGS. 8 through 12. FIG. 7 illustrates a cross-sectional view of a pedestal planar monolithic transistor structure which is described in the D. DeWitt patent application Ser. No. 875,013 filed Jan. 10, 1969. Briefly, the FIG. 7 pedestal structure is formed on a starting P- conductivity substrate 49 which includes a buried N+ subcollector region 51, and internal pedestal collector region 54 extending through a bottom epitaxial N- type conductivity layer 56 and into an upper epitaxial N- layer 58. A P type conductivity base region 60 is formed in the upper epitaxial layer 58, and a N type conductivity emitter region 62 is formed in the internal operational portion of the device. The internal portion of the device is that region between lines 54 and 66 extended transversely through the device. Conventional P isolation regions 68 and 70 extend down to the P- substrate 49 and electrically isolate the device during its operation. The N+ reach through region 72 provides a low resistivity path to the buried layer subcollector region 51. Metallic ohmic contacts are provided to the active regions of the pedestal transistor as illustrated.

Now referring to FIGS. 8 through 12 there is described a process for fabrication of a pedestal type structure having dielectric isolation. A starting P- substrate 84 is subjected to the conventional thermal oxidation process and photoresist techniques to form a mask for a subsequent diffusion to form the subcollector layer 86. The diffusion is a N+ diffusion using a suitable material such as arsenic having a $C_o$ of about $10^{21}$ atoms/cc. This diffusion can be made by a closed tube process, which is followed by a reoxidation cycle. All silicon dioxide is removed from the surface and a bottom epitaxial layer 88 is grown over the starting P- substrate 84. During the growth of the bottom epitaxial layer 88, the N+ region 86 is outdiffused to form the completed N+ subcollector region 86 as illustrated in FIG. 7. The bottom epitaxial layer 88 is constituted by a P type conductivity material having a thickness and resistivity of the range of 1.7-2.1 microns and 0.3-10 ohm-centimeters, respectively. In addition, the vertical and horizontal autodoping from the N+ subcollector forms an N- enclosure 95 around the N+ subcollector.

A silicon dioxide mask is formed using the usual thermal oxidation and photoresist techniques for diffusions required in the epitaxial layer 88 to form the buried isolation regions. The isolation regions 90 are formed by diffusing a material such as boron into the epitaxial layer 88 which had been done to adhere to present technology, especially heat cycle wise, as close as possible. In another step, a collector reach through region 92 and pedestal region 94 are formed by diffusing a N type dopant such as arsenic by closed tube technique into the epitaxial layer 88 in the appropriate locations. The reach through region provides a low resistivity region for ultimately connecting the collector metallurgy to the subcollector region. The regions 92 and 94 extend down into the buried layer or subcollector region 86 so as to form a unitary collector structure. The epitaxial layer 88 is then reoxidized and the silicon dioxide layer is stripped from the surface of the wafer.

Figure 8:
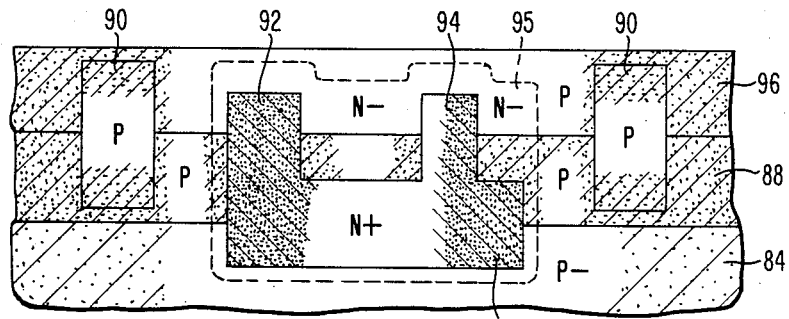
FIGS. 8, 9, 10 and 11 show sectional views of one fabrication method and resulting structure of a second embodiment of the present invention.

An upper epitaxial layer 96 is grown on the bottom epitaxial layer 88. During the growth of this upper epitaxial layer 96, the subcollector region 86, the isolation regions 90, the pedestal subcollector region 94 and the reach through region 92 further outdiffuse from the bottom epitaxial layer 88 and into the top epitaxial layer 96 to form the resulting structure which is illustrated in FIG. 8. As was mentioned before, the vertical and horizontal autodoping from the N+ subcollector forms an N- enclosure 95 around the N+ subcollector. In this example, a P epitaxial layer having a thickness of approximately 1.7-2.1 microns, and a resistivity of 0.3-10 ohm-centimeters is grown.

Figure 9:
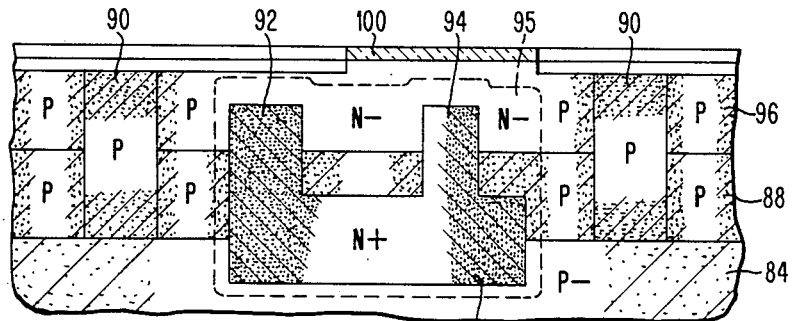
Figure 10:
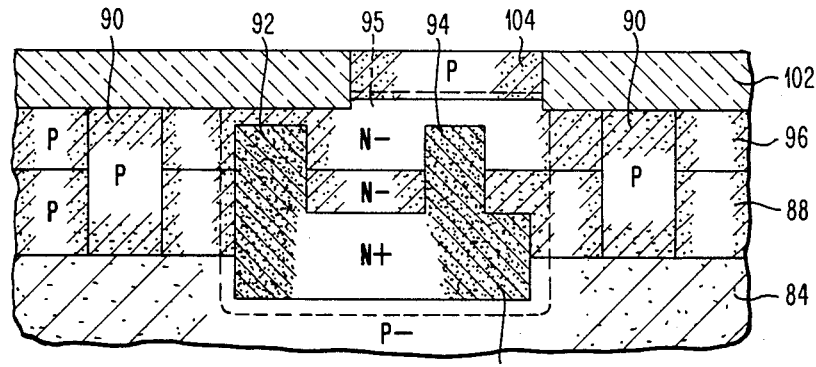

A silicon nitride protective layer is deposited by preferably a pyrolytic deposition involving silane and ammonium to form a layer of a thickness of about 500 Å-1000 Å. A suitable etchant such as phosphoric salt or hot phosphoric acid is utilized to remove the silicon nitride protective layer in all areas except at the location where the subsequent base and emitter diffusions are to be made. The resulting protective layer is shown in FIG. 9 as item 100. This etching technique is accomplished using the normal photoresist and etching technique. The resulting silicon nitride protective layer 100 is utilized as a mask for etching silicon to a depth of between about 3000 Å to 5000 Å. A preferred depth of etching the silicon is 3500 Å using a suitable silicon etchant such as 500 cc $HNO_3$+1 cc HF+7 mg Hg $(NO_3)_2$+$H_2O$ or Na (OH) solution. The resulting etched structure is shown in FIG. 9. The FIG. 9 body is then placed in a suitable oxidation atmosphere which may or may not contain water vapor. The oxidation cycle of post epi oxidation cycle has been used to fill up the etched groove with preferably about 5000 Å of silicon dioxide in thickness. Collector reach through is opened in the 5000 Å silicon dioxide and a suitable N+ dopant such as phosphorus is diffused. This is followed by a reoxidation cycle. The resulting silicon dioxide coating 102 is preferably about 8000 Å thick and should intersect with the N- enclosure 95 formed around the subcollector to isolate the base region. The resulting structure is shown in FIG. 10. The silicon nitride protective layer 100 is then removed with a dip etch using etchant described earlier. This opens the window for base diffusion. A base diffusion is then made into the silicon region to form base region 104. The base diffusion is preferably a boron P type diffusion.

A thin preferably 600 Å silicon dioxide layer 107 is formed in the base diffusion window using conventional thermal oxidation. A layer of silicon nitride or pyrolytic silicon dioxide 108 is deposited over the entire structure. Where silicon nitride is utilized, openings are provided in the silicon nitride layer for the emitter and collector contact using conventional photoresist techniques. The silicon nitride is then etched in these areas with an etchant described before and the thermally grown silicon dioxide is removed using the silicon dioxide as the etching mask. N+ diffusion of an impurity such as phosphorus or arsenic is then made into the silicon to form emitter region 106. Openings are provided in the silicon nitride 108 and silicon dioxide 107 layers for base and isolation contacts using the same technique described above.

Figure 11:
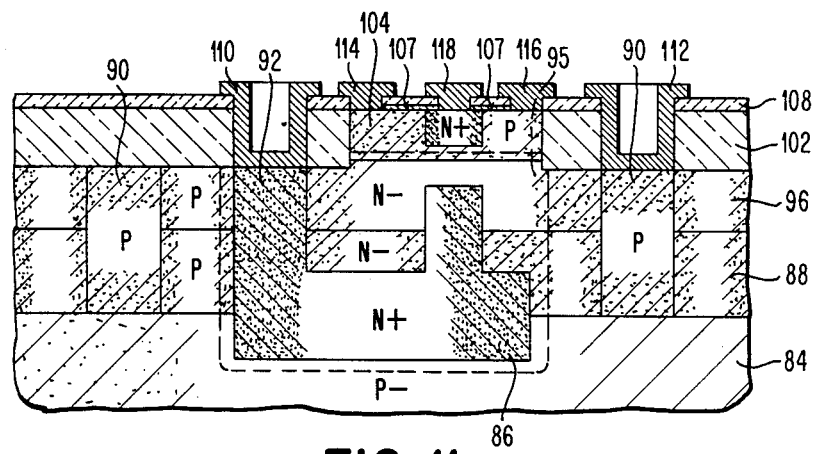

CrAgCr is deposited on the surface and using photoresist techniques the CrAgCr is sputter etched to leave CrAgCr on the collector contact 110, the isolation diffusion contact 112, the base element contacts 114 and 116, and the emitter contact 118. The resulting structure shown in FIG. 11 is dielectrically isolated in the base and emitter regions. Junction isolation 90 is present in depth in this particular embodiment. However, it is not necessary for the electrical isolation of this pedestal bipolar device.

Figure 12:
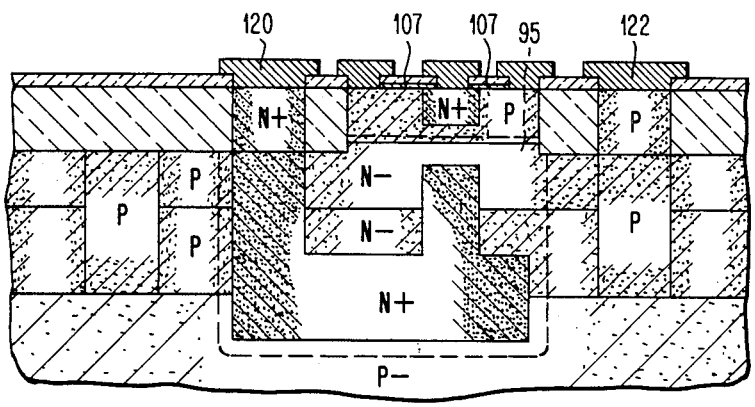
FIG. 12 shows a sectional view of a variation of the second embodiment.

FIG. 12 shows a further modified embodiment of the structure of FIG. 11. In this embodiment the resulting structure is substantially planar. To achieve this planarity, the silicon nitride protective coating 100 is allowed to remain over the collector reach through contact and the isolation diffusion contact which results in no etching in these areas and no thermal oxidation to silicon dioxide of these areas. These semiconductor reach throughs thus allow respectively the collector contact 120 and the isolation contact 122 to be at the surface. This planarity increases the reliability and manufacturability of the metallization patterns on the surface of the monolithic device.

The electrical characteristics of a semiconductor device made according to the FIGS. 8–11 embodiment are shown in the following.

| BVEBO | 5 V | |
| --- | --- | --- |
| BVCBO | 17.2 V | |
| BVCEO ($I_c$ = 0.01) | 5.8 V | @ $I_E$ = .01 m A |
| BVCES | 17.3 V | |
| HFE @ .5 m A | 44 | |
| HFE @ 10 m A | 23 | |
| Base to base breakdown | 14 V | |
| Collector to collector breakdown | 14 V | |
| $T_d$ avg | 393 ps | (out of phase) |
| $T_d$ avg | 405 ps | (in phase) |
| $C_{CB}$ | 0.1 pF | | in which

BVEBO=emitter-base breakdown voltages with collector open circuited, 5 V, measured at 0.01 m A ($I_e$) emitter current;

BVCBO=collector-base breakdown voltage with emitter open circuited, 17.2 V, measured at 0.01 m A ($I_c$) collector current;

BVCEO=emitter to collector breakdown voltage with base open circuited, 5.8 V, measured at 0.01 m A emitter current;

BVCES=emitter to collector breakdown voltage with base short circuited to emitter, measured as 0.01 m A emitter current.

HFE @ 0.5 m A=current gain measured at 0.5 m A collector current;

HFE @ 10 m A=current gain measured at 10 m A collector current;

$T_d$ avg=average (out of phase, in phase) delay time;

$C_{CB}$=collector-base capacitance.

The delay time was measured using a current switch emitter follower circuit with one input and a 50 ohm load. The results indicate that the recessed oxidation does not degrade the device and circuit performance as compared to the conventional prior art process. No leakage was detectable with the curve tracer between bases. This clearly shows that the method of recessed oxidation gives good electrical isolation. As mentioned before, isolation diffusion has been performed for heat cycle purposes and prior art size subcollector was used to deviate as little from standard process as possible for comparison purposes.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A dielectrically isolated semiconductor device comprising:
    a semiconductor substrate of one conductivity type;
    an epitaxial layer of the opposite conductivity type on said substrate;
    a first buried region of said opposite conductivity type partially in said substrate and said epitaxial layer;
    a second buried region of said one conductivity type partially in said substrate and said epitaxial layer;
    at least one semiconductor device located in said epitaxial
    layer above said first buried region; and
    a dielectrically isolating region surrounding said semiconductor device and extending from the surface of said epitaxial layer partially through said epitaxial layer to intersect with both said buried regions.

2. The semiconductor device of claim 1 wherein said dielectrically isolating region extends about halfway through said epitaxial layer.

3. The semiconductor device of claim 1 wherein said substrate is of p conductivity type and said epitaxial layer is of n conductivity type.

4. The semiconductor device of claim 1 wherein said device is a transistor.

5. The semiconductor device of claim 1 wherein said device is a resistor.

6. The semiconductor device of claim 1 wherein said device is a bipolar transistor and the emitter and base regions thereof are located in said epitaxial layer above said first buried region.

7. The semiconductor device of claim 6 wherein said first buried region is the collector element of the device and a semiconductor reach through region to said collector element is isolated from said base and emitter regions by a portion of said dielectrically isolating region.

8. The semiconductor device of claim 6 wherein the surface available for electrical contact to said emitter, base and collector elements is substantially planar.

9. The semiconductor device of claim 8 wherein the base contact is located on the surface of the base region immediately adjacent to the dielectric isolation.

* * * * *